US010312563B2

(12) United States Patent
Brannon et al.

(10) Patent No.: US 10,312,563 B2
(45) Date of Patent: Jun. 4, 2019

(54) CERAMIC FILTER WITH DIFFERENTIAL CONDUCTIVITY

(71) Applicant: LGS INNOVATIONS LLC, Herndon, VA (US)

(72) Inventors: Alan Scott Brannon, Denver, CO (US); Jeffrey Jan Nummerdor, Jr., Rio Rancho, NM (US); Scott W. Burgess, Albuquerque, NM (US)

(73) Assignee: LGS Innovations LLC, Herndon, VA (US)

( * ) Notice: Subject to any disclaimer, the term of this patent is extended or adjusted under 35 U.S.C. 154(b) by 0 days.

(21) Appl. No.: 15/720,277

(22) Filed: Sep. 29, 2017

(65) Prior Publication Data

US 2018/0131062 A1 May 10, 2018

Related U.S. Application Data

(60) Provisional application No. 62/418,971, filed on Nov. 8, 2016.

(51) Int. Cl.
| | |
|---|---|
| *H01P 1/20* | (2006.01) |
| *H03H 7/46* | (2006.01) |
| *H04B 1/40* | (2015.01) |
| *H01P 1/208* | (2006.01) |
| *C30B 25/00* | (2006.01) |
| *H01P 1/205* | (2006.01) |

(52) U.S. Cl.
CPC ............ *H01P 1/2002* (2013.01); *C30B 25/00* (2013.01); *H01P 1/2056* (2013.01); *H01P 1/2084* (2013.01); *H03H 7/463* (2013.01); *H04B 1/40* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,065,120 A | * | 11/1991 | Munn | .................. H01P 1/2056 333/134 |
| 5,198,788 A | * | 3/1993 | Phillips | ................ H01P 1/2056 333/207 |

(Continued)

FOREIGN PATENT DOCUMENTS

EP          1 280 223 A1     1/2003

*Primary Examiner* — Junpeng Chen
(74) *Attorney, Agent, or Firm* — Baker & Hostetler LLP

(57) ABSTRACT

The present application is directed to a filter and methods of making the same. The filter includes a block of dielectric material with a top surface including a patterned region, a bottom surface, and side surfaces. The filter also includes a through-hole extending through the block from the top surface to the bottom surface. The through-hole is partially surrounded by the patterned region. The filter also includes a wall extending from the top surface, the wall having an inner surface, an outer surface, and a roof. The bottom surface, side surfaces, outer surface, and roof have a first coating of silver and glass frit. The patterned region, through-hole and inner surface have a second coating of silver and glass frit. The glass frit in the first coating is at least 0.5% greater than the glass frit in the second coating. The application is also directed to a system including a printed circuit board and a filter.

20 Claims, 6 Drawing Sheets

(56) References Cited

U.S. PATENT DOCUMENTS

| | | | |
|---|---|---|---|
| 5,208,568 A * | 5/1993 | Sassin | H01P 1/2056 |
| | | | 29/600 |
| 5,304,967 A | 4/1994 | Hayashi | |
| 5,599,413 A * | 2/1997 | Nakao | H01L 21/486 |
| | | | 156/253 |
| 7,397,332 B2 | 7/2008 | Ishikawa | |
| 7,439,840 B2 | 10/2008 | Carastro et al. | |
| 7,489,914 B2 | 2/2009 | Govind et al. | |
| 7,956,708 B2 * | 6/2011 | Bates | H01P 1/2088 |
| | | | 333/212 |
| 8,947,178 B1 * | 2/2015 | Reid, Jr. | H01P 1/2053 |
| | | | 333/207 |
| 9,287,601 B2 | 3/2016 | Yin et al. | |
| 9,401,537 B2 | 7/2016 | Hendry et al. | |
| 2005/0092181 A1 * | 5/2005 | Shih | B01D 46/0028 |
| | | | 95/283 |
| 2005/0237134 A1 * | 10/2005 | Furuya | H01P 1/20 |
| | | | 333/202 |

\* cited by examiner

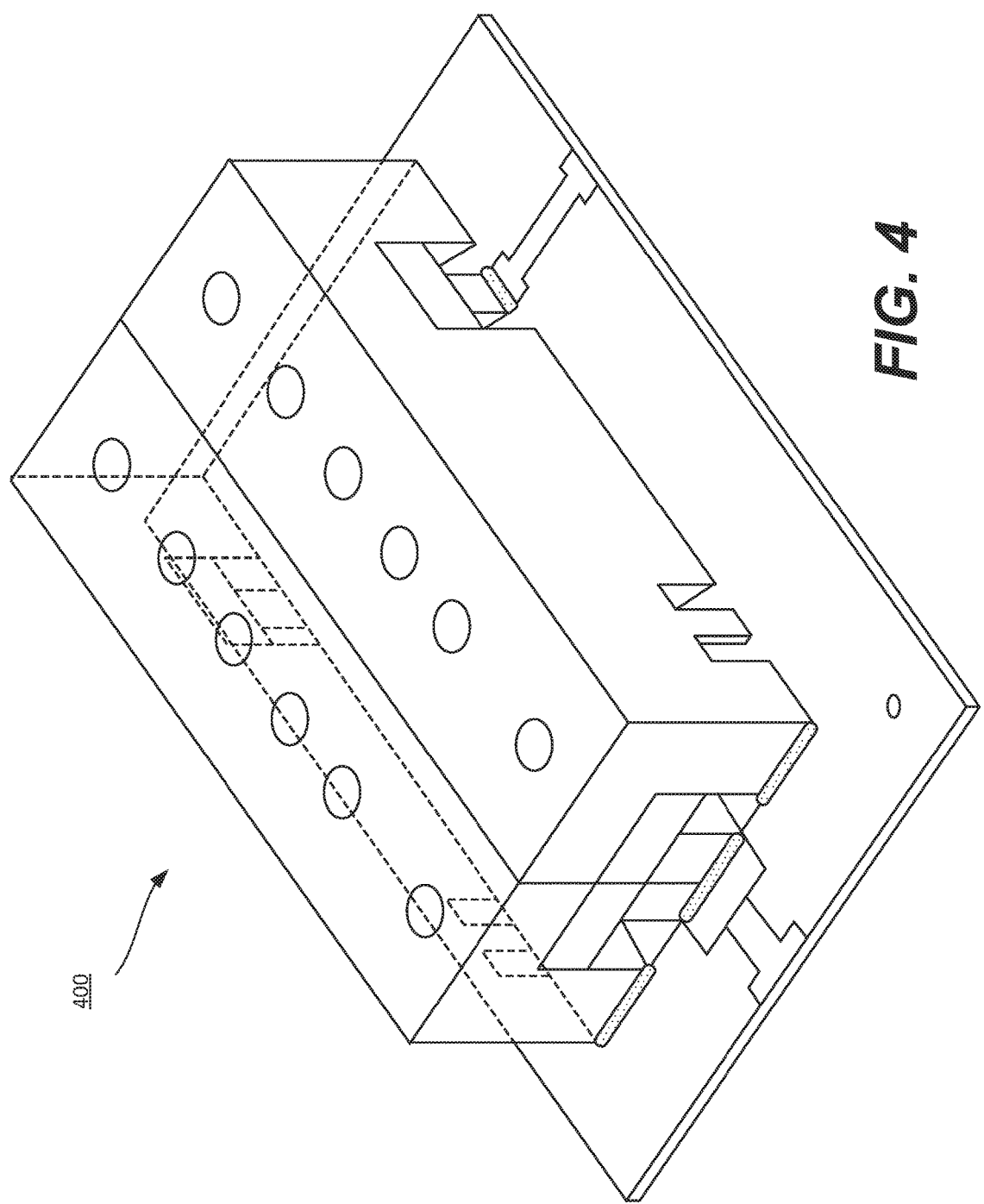

CERAMIC FILTER WITH DIFFERENTIAL CONDUCTIVITY

CROSS-REFERENCE TO RELATED APPLICATIONS

This application claims the benefit of priority of U.S. Provisional Application No. 62/418,971 filed Nov. 8, 2016, entitled "Ceramic Filter with Differential Conductivity," the contents of which is incorporated by reference in its entirety herein.

FIELD

This application is generally related to an apparatus and method for improving mechanical strength and the Q factor of a ceramic filter.

BACKGROUND

Generally, transmitters and receivers in radio equipment utilize the same antenna. Accordingly, the transmission network controls both the transmission signal and the receiving signal. By so doing, the signal from the antenna is directed to the receiver without any substantial interference from the transmitter, and the signal from the transmitter is transmitted to the antenna without interference from the receiver.

Ceramic filters are typically employed in radio equipment to reduce substantial interference. In particular, duplex ceramic filters including two individual band-pass filters are employed. One filter connects the receiving branch and has a center frequency and bandwidth corresponding to the receiving band. The other filter connects the transmission branch and has a center frequency and bandwidth corresponding to the transmission band.

Conventional ceramic filters include a dielectric ceramic material for the main body upon which metallic materials are applied for producing conducting paths. These paths define the performance of the filter and for realization of pads or other isolated conducting areas that contact the printed circuit board or other interface material. An essential aspect of the performance of a given filter or duplexer device is the Q factor.

The Q factor or simply Q defines the loss in the filter. The relationship between the total Q of a given device and the Q factors of the ceramic dielectric material and the conducting paths and/or areas is defined by: $1/Q_{total}=1/Q_{dielectric}+1/C_{conducting}$. Typically the Q of the dielectric material is much higher than the Q of the conducting paths and/or areas. As a result, the overall Q of the filter is predominantly determined by the Q of the conducting paths and/or areas.

Dielectric filters compete with air dielectric filters which exhibit Q factors on the order of 20,000 and higher. Meanwhile, high quality ceramic filters exhibit Q factors on the order of 2,000. What is needed in the art is a method of designing a dielectric filter with Q factor values approaching those of air dielectric filters. What is also needed in the art is a dielectric filter having a specific arrangement of conductive materials resulting in a high Q factor resembling that of an air dielectric filter.

SUMMARY

The foregoing needs are met, to a great extent, by the invention, with an apparatus and method for manufacturing a filter with improved Q factor values.

One aspect of the application is directed to a filter and methods of making the same. The filter includes a block of dielectric material with a top surface including a patterned region, a bottom surface, and side surfaces. The filter also includes a through-hole extending through the block from the top surface to the bottom surface. The through-hole is partially surrounded by the patterned region. The filter also includes a wall extending from the top surface, the wall having an inner surface, an outer surface, and a roof. The bottom surface, side surfaces, outer surface, and roof have a first coating of silver and glass frit. The patterned region, through-hole and inner surface have a second coating of silver and glass frit. The glass frit in the first coating is at least 0.5% greater than the glass frit in the second coating. The application is also directed to a system including a printed circuit board and a filter.

Another aspect of the application is directed to a system including a printed circuit board and filter. The printed circuit board has a top surface and includes an input and output pad. The filter includes a block of dielectric material with a top surface including a patterned region, a bottom surface, and side surfaces. The filter includes a through-hole extending through the block from the top surface to the bottom surface. The filter also includes a wall extending from the top surface having an inner surface, an outer surface, and a roof. The wall includes a first post formed between two spaced-apart slots extending from the inner surface to the outer surface. The wall also includes a second post formed between two other spaced-apart slots extending from the inner surface to the outer surface. The bottom surface, side surfaces, outer surface and roof of the filter have a first coating of silver and glass frit. The patterned region, through-hole and inner surface of the filter have a second coating of silver and glass frit. The first and second coatings have different compositions.

A further aspect of the application is directed to a method of patterning a filter. The method includes the step of providing a dielectric block filter including a top surface, a bottom surface, and side surfaces. The block filter also includes a through-hole extending through the block from the top surface to the bottom surface. A wall extends from the top surface, the wall having an inner surface, an outer surface, and a roof. The method includes a step of masking the top surface, through-hole, and inner surface of the wall. The method also includes a step of depositing a first coating of silver containing glass frit on the side surfaces, outer surface and roof. The method further includes a step of masking side surfaces, outer surface and roof. The method further includes a step of depositing a second coating of silver containing glass frit on the top surface, through-hole, and inner surface of the wall. Even further, the method includes a step of etching the second coating deposited on the top surface such that an area entirely surrounding the through-hole includes the second coating. Lastly, the amount of glass frit in the first coating of Ag is at least 20% greater than the glass frit in the second coating of Ag.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

BRIEF DESCRIPTION OF THE DRAWINGS

In order to facilitate a fuller understanding of the invention, reference is now made to the accompanying drawings.

FIG. 4 illustrates a duplex filter on a printed circuit board according to an aspect of the application.

DETAILED DESCRIPTION

Figure 1:
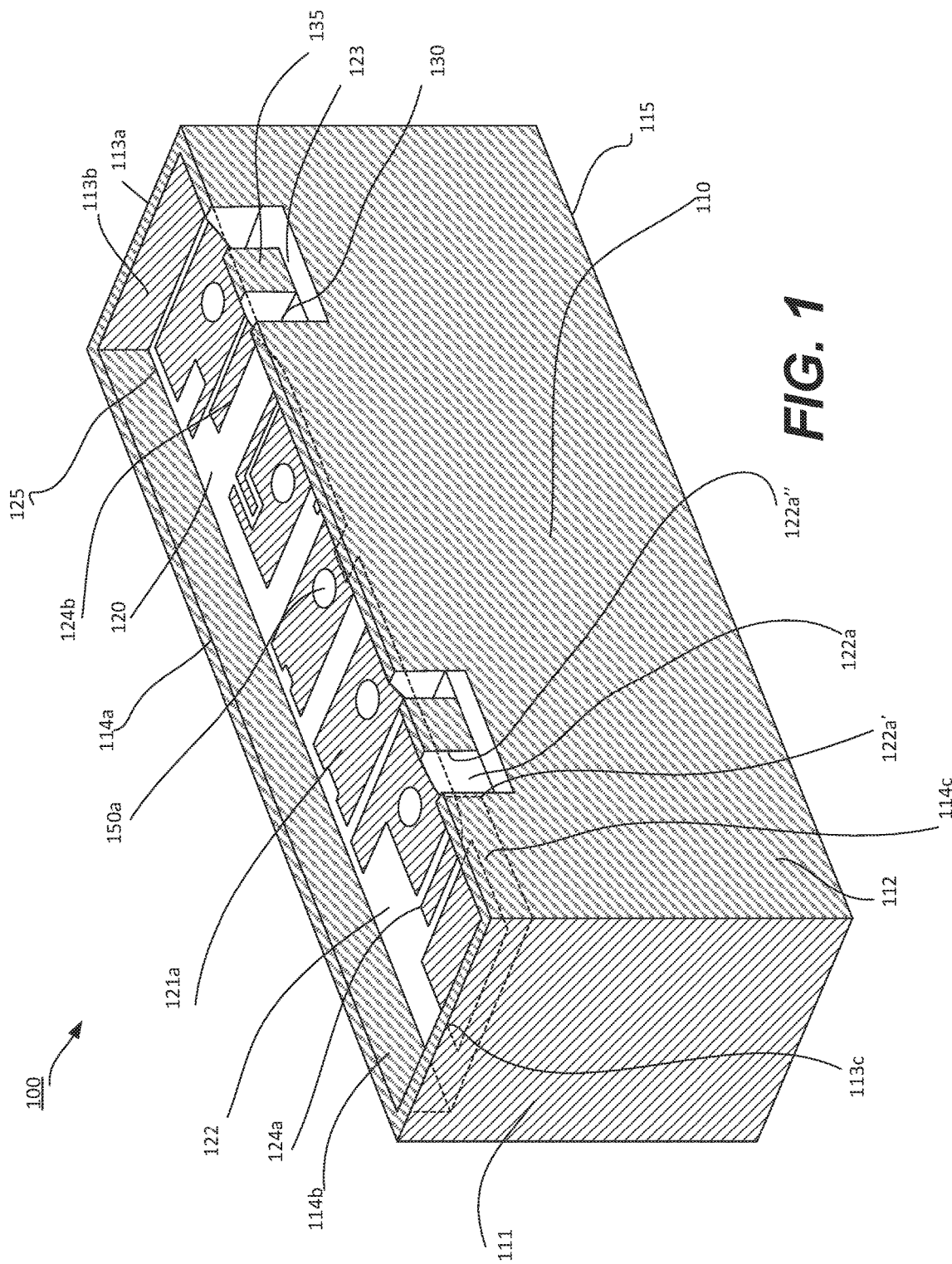
FIG. 1 illustrates a filter according to an aspect of the application.

In this respect, before explaining at least one embodiment of the invention in detail, it is to be understood that the invention is not limited in its application to the details of construction and to the arrangements of the components set forth in the following description or illustrated in the drawings. The invention is capable of embodiments or embodiments in addition to those described and of being practiced and carried out in various ways. Also, it is to be understood that the phraseology and terminology employed herein, as well as the abstract, are for the purpose of description and should not be regarded as limiting.

Reference in this application to "one embodiment," "an embodiment," "one or more embodiments," or the like means that a particular feature, structure, or characteristic described in connection with the embodiment is included in at least one embodiment of the disclosure. The appearances of, for example, the phrases "an embodiment" in various places in the specification are not necessarily all referring to the same embodiment, nor are separate or alternative embodiments mutually exclusive of other embodiments. Moreover, various features are described which may be exhibited by some embodiments and not by the other. Similarly, various requirements are described which may be requirements for some embodiments but not by other embodiments.

It has been determined by the inventors and described herein that the inventive techniques provide increased mechanical strength for dielectric filters, and a higher Q factor resembling values similar to those of an air dielectric filter.

A further major benefit of applying the techniques described in this application to filters includes reducing the effective values and effects of resistive elements in the device. Moreover, power handling capabilities of the device are increased. Lower effective resistance has the effect of lowering power dissipation in the device, thus lowering thermal heating effects. Thus, the device is capable of handling higher power signals, as may be needed, for example, when the filter or a companion filter is used in the transmit path.

Ceramic filters generally include a single type of material for all conduction paths, pads and other conductive elements. Typically, conducting-type material is deposited on the device through a process known as electroding. Often, there is a need for soldering or epoxy-attaching given devices to a printed circuit board. The strength of the conductor bond between a device and the board requires using a conducting material containing glass frit in combination with more pure silver conductive material. The conductivity of materials with a higher glass frit content is significantly less than more pure silver with less frit content by about 10 fold, while adhesion of the higher frit silver material is 6 fold that of pure silver.

Generally, a pattern of metallized and un-metallized areas is defined on a filter. The pattern includes a recessed area of metallization that covers at least a portion of the top surface and areas which cover the bottom and side surfaces, the through-holes, and at least a portion of the walls or posts.

In one aspect of the application, the inventors have selectively employed Ag material with a higher frit content in areas of the device where strong adhesion to a circuit board is required. Other metalized areas are advantageously electroded with more pure silver containing less glass frit in high current areas where mechanical strength is not needed. Selective masking of these filter locations coupled with plural coating steps are employed. This technique advantageously enables lower losses due to the lower resistivity of purer silver. In addition, improvement in the Q factor of ceramic filters enables electrical performance closer to that of air cavity filters.

FIG. 1 illustrates a radio frequency (RF) filter 100 in accordance according to an aspect of the application. The filter may be made formed in any shape. In an exemplary embodiment, the filter 100 has an elongate, parallelepiped or box-shaped rigid block or core 110 comprised of a ceramic dielectric material having a desired dielectric constant.

The filter 100 includes four side surfaces. Two of the four side surfaces are minor side surfaces 111. The other two of the four side surfaces are major side surfaces 112. The filter 100 also includes a bottom surface 115 and a top-recessed surface 120. The top surface 120 is generally parallel and opposed to the bottom surface.

The filter 100 also includes four generally planar walls that extend upwardly from the top surface 120. In one embodiment, the planar walls extend upwardly and/or outwardly along a perimeter of the top surface. In another embodiment, the planar walls are unitary portions of the major 112 and minor 111 side surfaces. Planar walls of the minor side surfaces are 113, and planar walls of the major side surfaces are 114.

Walls 113, 114, and top surface 120 define a cavity 125. Top surfaces 113a of wall 113 and top surfaces 114a of wall 113 form a peripheral rim 115 of a predetermined thickness. The thickness of the roof is dependent upon the width and length of the cavity 125.

Inner walls 113b of wall 113 of the minor surface 111, inner walls 114b of wall 114 of the major surface 112, and the top surface 120 can be plated or deposited with a first coating containing less frit content. The first coating will be described in more detail below.

In an embodiment, outer walls 113c and 114c of walls 113 and 114 are coextensive and coplanar with major 111 and minor 112 surfaces, respectively. In one embodiment, the roof 113a, 114a are planar. In another embodiment, the roof slopes downward from the inner to outer surfaces of the walls 113, 114. In yet another embodiment, the roof slopes upward from the inner to outer surfaces of the walls 113, 114. The slope are be envisaged to be any angle.

As shown in FIG. 1, planar wall 114 includes plural, spaced-apart slots 130. For example, the slots extend through the planar wall 114 from the inner 114b to the outer 114c surface. The slots 130 may have similar or different lengths extending between two minor side surfaces 111. In an embodiment, a post 135 may be formed in the planar wall 114 between two spaced-apart slots 130. The plural posts 135 may have similar or different lengths.

The top surface 120 may include plural through-holes 150. The through-holes 150 extend from the top surface 120 to the bottom surface 115 (not shown) of the body 100. The through-holes 150 act as resonators. The though-holes are metallized. In an embodiment, the through-holes 150 are aligned in a spaced-apart, co-linear relationship and are also equal distances from the side surfaces. Each of through-holes 150 is defined by an inner cylindrical metallized side-wall surface.

Top surface 120 additionally defines a surface-layer recessed pattern of electrically conductive metallized 121a and insulative, un-metallized 122 areas or patterns. The metallized areas 121a are preferably a surface layer of conductive silver-containing material. Recessed pattern 121a defines a wide area or pattern of metallization that covers the surface. In an embodiment, the recessed pattern 121a, through-holes 150, and inner walls 113b, 114b are deposited with a first coating including a metal and frit. More specifically, the metal is a precious. Even more specifically, the metal is silver (Ag).

Meanwhile, the bottom surface 115, side surfaces 111, 112, outer planar walls 113c, 114c, and top rim 113a, 114a are deposited with a second coating including a metal and frit. The metal may be precious. In particular, the metal is silver. The frit content in the second coating is greater than the first coating. In an embodiment, the frit content is at least 20% greater in the second coating. In an exemplary embodiment, the frit content is at least 25% greater in the second coating. In a further exemplary embodiment, the frit content is at least 30% greater in the second coating. In a yet a further exemplary embodiment, the frit content is at least 35% greater in the second coating. In even a further exemplary embodiment, the frit content is at least 40% greater in the second coating. The first coating also extends contiguously within the through-holes 150 from the top surface 120 to the bottom surface 115. The first coating may have a maximum silver content of 99.9998%. Any more silver and it will not bond to the substrate for any length of time.

In an embodiment, a portion of metallized area 121a is present in the form of resonator pads 121a, 121b, 121c, 121d, 121d, 121e and 121f (121a is representative as illustrated by the reference indicator in the drawing). Each of these resonator pads partially surrounds a through-hole 150a-f (150a is representative as illustrated by the reference indicator in the drawing) opening located on the top, recessed surface 120. In an exemplary embodiment, each resonator pad entirely surrounds one of through-holes, respectively. The resonator pads are contiguous with the metallization area 121a that extends through the inner surfaces of the through-holes. Resonator pads 121a-f (121 is representative as illustrated by the reference indicator in the drawing) are shaped to have predetermined capacitive couplings to adjacent resonators and other areas of surface-layer metallization.

An un-metallized area or pattern 122 extends over portions of top surface 120. Un-metallized area 122 surrounds all of the metallized resonator pads 121a-f. In addition, portions of inner planar walls 113b, 114b and roofs 113a, 114a are un-metalized.

Un-metallized area 122 extends on the top surface 120 in slot 122a (122a is representative as illustrated by the reference indicator in the drawings). The un-metallized area 122 also extends onto side wall slot portions 122a', 122a", 122b', 122b", 122c', 122c", 122d' and 122d" (122a' and 122a" are representative). Side wall slot portions 122a' and 122a" define opposed side walls of the post 135.

In another embodiment, un-metallized area 122 can also extend onto a portion 123 of side surface 112 located below the post 135. Portion 123 can also extend below the slots 130. These un-metallized areas co-extensive or joined or coupled with each other in an electrically non-conducting relationship.

Surface-layer pattern 40 additionally defines a pair of isolated conductive metallized areas 124a, 124b for input and output connections to filter 100. An input connection area or electrode 124a and an output connection area or electrode 124b are defined on top surface 120 and extend onto a portion of the planar wall 114 and side surface 112. The electrodes can serve as surface mounting conductive connection points or pads or contacts Electrodes 124a, 124b are located adjacent and parallel to side surfaces 111.

Each of the electrodes is located between two resonator pads 121a-f. Electrodes 124a, 124b are surrounded on all sides by un-metallized areas 122.

In another embodiment, the recessed surface pattern 120 includes metallized 121 areas and un-metallized 122 areas. As a result, metallized areas are spaced apart from one another and capacitively coupled. The amount of capacitive coupling is roughly related to the size of the metallization areas and the separation distance between adjacent metallized portions as well as the overall core configuration and the dielectric constant of the core dielectric material. Similarly, surface pattern 120 also creates inductive coupling between the metallized areas.

Figure 2:
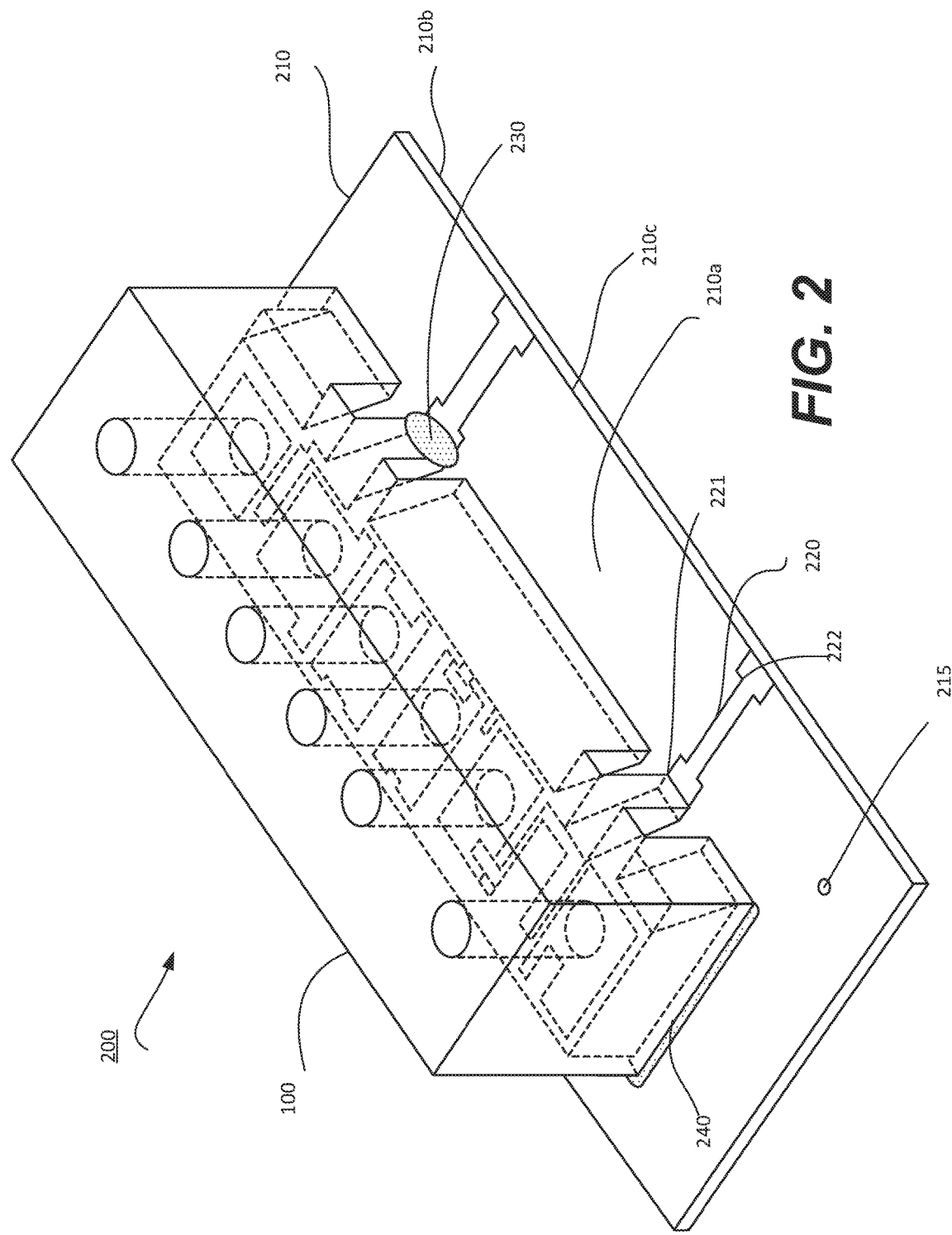
FIG. 2 illustrates a filter on a printed circuit board according to an aspect of the application.

According to another aspect, filter 100 is illustrated as being mounted to a generally planar rectangular shaped circuit board 210 in FIG. 2. In one embodiment, circuit board 210 is a printed circuit board having a top or top surface 210a, bottom or bottom surface 210b and sides or side surfaces 210c. Circuit board 210 has a height of a predetermined thickness. Circuit board 210 also includes plated through-holes 215 that form an electrical connection between the top and the bottom of the circuit board 210. Several circuit lines 220 and input/output connection pads 221 can be located on top the top surface and connected with terminals 222. Circuit lines 220, connection pads 221, and terminals 222 can be formed, for example, from metal such as copper. Terminals 222 connect the filter 100 with an external electrical circuit (not shown).

A post of the filter 100 can be attached to the PCB 200 at the connection pad(s) 221 by solder 230. In an embodiment, one or both of the input 124a and output 124b electrodes can be attached to the solder 230.

Circuit board 200 has a generally rectangular-shaped ground ring or line 240. It can be disposed on the top surface. The line 240 can be formed around the rim of the filter. The ground ring can be formed from copper. Next, the filter 100 can be placed on top 302 such that input electrode portion 124a and output electrode portion 124b are aligned with connection pads 221. Circuit board 200 and filter 100 may arranged in a reflow oven to melt and reflow the solders.

As illustrated in FIG. 2, filter 100 is mounted to the board 200 in a top side down relationship. As a result, the top surface 120 is located opposite, parallel to, and spaced from the top 210 of board and the rim of 113a, 114a of the filter are soldered to the top of the PCB. In this relationship, cavity 125 is partially sealed to define an enclosure defined by the top, recessed surface 120, the board surface 210a, and the walls 111, 112 of the filter. It is further noted that, in this relationship, the through-holes in filter are oriented in a relationship generally normal to the board 200.

The use of filter 100 with recessed top surface pattern 120 facing and opposite the board provides improved grounding and off band signal absorption; confines the electromagnetic fields within cavity 125. The arrangement also prevents external electromagnetic fields outside of cavity 125 from causing noise and interference such that the attenuation and zero points of the filter are improved. The arrangement of the cavity also prevents the electromagnetic fields from interfering and coupling with other components mounted near filter 100. The technology allows the same footprint to be used across multiple frequency bands. In addition, during solder reflow, filter 100 tends to self-align with the ground ring 240 on the circuit board. The Filter exhibits improved self-alignment since the surface tension of the liquid solder during reflow is distributed equally around roof between the ground ring and rim providing self-centering of the filter's core 110.

The use of a filter 100 defining a cavity and a recessed top surface pattern 40 facing and opposite the board eliminates the need for a separate external metal shield or other shielding as currently used to reduce spurious electromagnetic interference incurred.

Recessed pattern creates a resonant circuit that includes a capacitance and an inductance in series connected to ground. The shape of pattern determines the overall capacitance and inductance values. The capacitance and inductance values are designed to form a resonant circuit that suppresses the frequency response at frequencies outside the passband including various harmonic frequencies at integer intervals of the passband.

Figure 3:
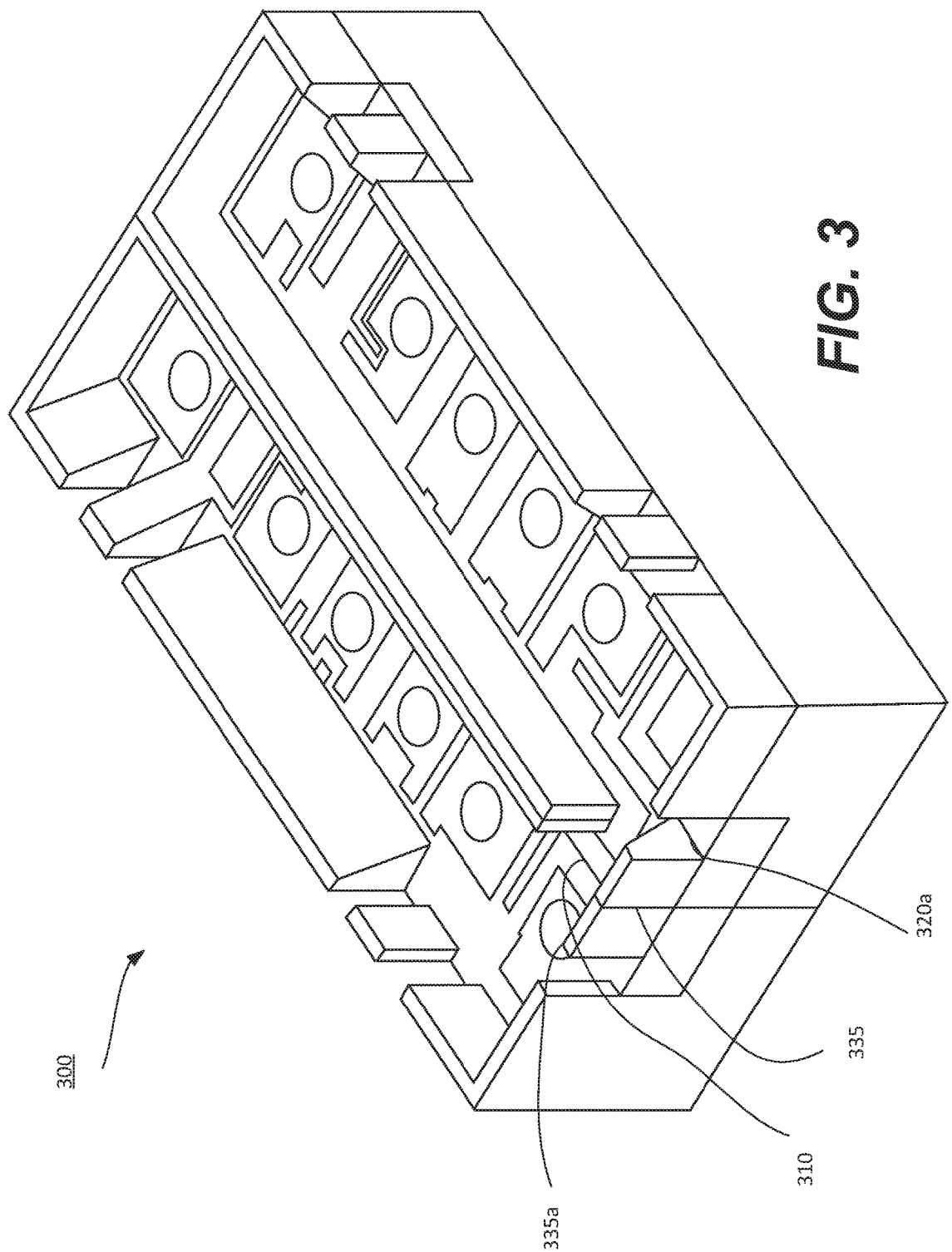
FIG. 3 illustrates a duplex filter according to aspect of the application.

According to another embodiment as shown in FIG. 3, a duplex filter 300 is described and includes two filters 100. Here, the two simplex filters are adjoined along major side surfaces 112 creating a duplex filter. In particular, in each filter 100, a slot 310 is formed in the wall 114 opposing the wall 114 having a post 135 formed therein. Because the slot 310 is formed between two filters 100, the thickness of the slot 310 is twice the thickness of a slot 130 each filter.

In an embodiment, each of the filters 100 in the duplex filter 300 includes a slot 320 (320a is shown, and 320b is not shown) on a minor side surface 111. A post 335 is formed between the two slots 320a, 320b. In one embodiment, a portion of an inner wall of post 335 is located adjacent slot 310. A top surface of the post extends between minor side surfaces 111 of two filters. A thickness of the post may vary between the post's inner and outer walls.

According to another aspect, the duplex filter 300 may be joined to a PCB 200 as shown in the system 400 of FIG. 4. The recitation of the filter and circuit board were provided above in the description. Here, the post 335 is coupled to the PCB 200 via solder. Circuit lines, connection pads, and terminals can be formed, for example, from metal such as copper. Terminals connect the filter 100 with an external electrical circuit (not shown).

Figure 5A:
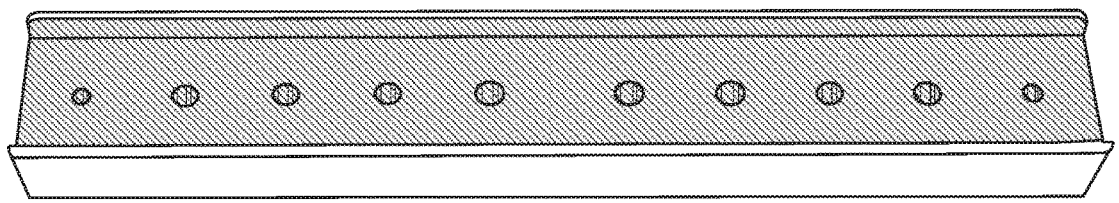
FIGS. 5A-5E illustrates method of forming a filter according to an aspect of the application.

According to yet another aspect of the application, a method of making a ceramic filter is illustrated in FIGS. 5A-5F. As shown in FIG. 5A, a monoblock filter without any coatings is provided. The dimensions and characteristics of the filter were described above in detail. In step 5A, a mask is applied to the top surface 120, inner wall 112b, 114b and through-holes 150. The mask can be made from any material including, for example, tape, cardboard, plastic, rubber, etc.

Figure 5B:
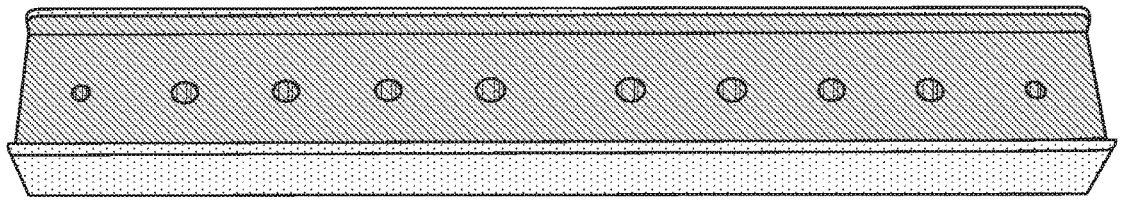

In FIG. 5B, the side surfaces 111, 112, outer surfaces of planar walls 113c, 114c, top surface of planar walls 113a, 114a (also known as rim), and bottom, short-circuited side 115 are deposited with a coating. As discussed above, the coating includes silver and glass frit. The amount of glass frit is greater than 0.5% of the composition. In an embodiment, the amount of glass frit is greater than 1% of the composition. In another embodiment, the amount of glass frit is greater than 1.5% of the composition. In another embodiment, the amount of glass frit is less than about 2% of the composition.

Figure 5C:
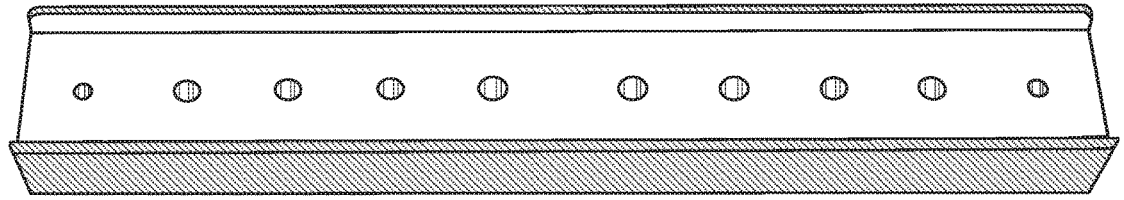
Figure 5D:
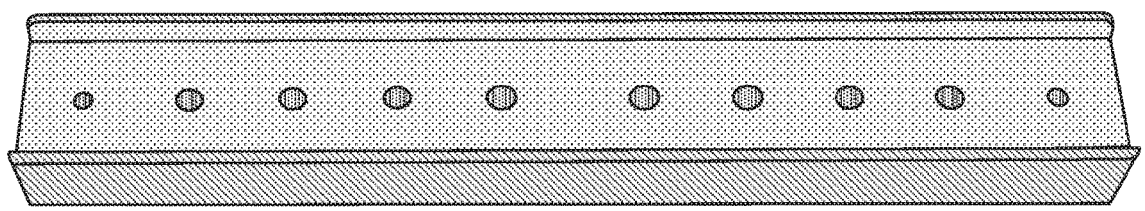

In FIG. 5C, the side surfaces, outer and top of the planar walls and bottom surface (excluding through-hole area) are masked. The type of mask is similar to the mask discussed above. In FIG. 5D, the top recessed surface 120, inner wall 112b, 114b and through-holes are deposited with a coating. The coating has a composition including less glass frit than the deposition coating on the side surfaces 111, 112. By so doing good bond strength with reasonable conductivity are exhibited. In areas where exceptional bond strength is not required, such as the top surface 120 and inner walls 113b, 114b, purer silver is used thereby lowering the resitivity and increasing the overall Q of the device.

Figure 5E:
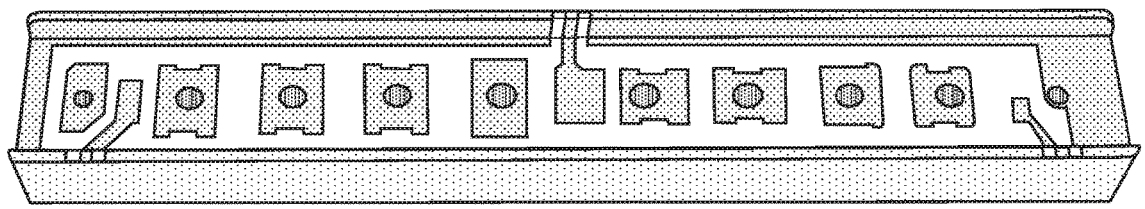

In FIG. 5E, a patterned mask is provided on the top surface 120 to etch away areas having a metallized coating 121. The electrodes 124a, 124b are also formed by the etching step. By so doing, the metallized areas surrounding the throughholes 150 are formed. In addition, the through-holes are metallized.

Alternative in FIGS. 5D and 5E, a patterned mask is applied to the top surface 120. Thereafter, a deposition step is performed creating patterns of metallized 121 and unmetallized 122 areas as shown in FIG. 5E. Moreover, the mask permits the through-holes 150 to be deposited with a coating.

Results

A single resonator filter was used to measure the difference in Q. Each filter was measured 3 times to help eliminate potential gauge R&R issues. Two different styles of measurements were taken, each by a different engineer. One of the techniques is a transmission method. This was conducted by engineer 1. The other technique is a reflective method. This was conducted by engineer 2. The Control has a Ag:frit content of 99:1%.

Both methods yielded similar results. Specifically, the change in Q exhibited during the transmission technique in comparison with the control is 2.59%. The change in Q exhibited during the reflective technique in comparison with the control is 3.86%. According to the data, the average Q of the transmission and reflection is about 3%.

TABLE 1

| | | | | Engr. 1 | | | | | |
| --- | --- | --- | --- | --- | --- | --- | --- | --- | --- |
| | Measurement 1 | | | Measurement 2 | | | Measurement 3 | | |
| Group 2 | FO | BW | Q | FO | BW | Q | FO | BW | Q |
| 1 | 2143 | 1.40 | 1536 | 2142 | 1.43 | 1500 | 2143 | 1.37 | 1565 |
| 2 | 2140 | 1.38 | 1555 | 2142 | 1.38 | 1555 | 2142 | 1.37 | 1565 |
| 3 | 2145 | 1.38 | 1560 | 2145 | 1.38 | 1550 | 2145 | 1.36 | 1572 |
| 4 | 2139 | 1.46 | 1470 | 2139 | 1.40 | 1530 | 2139 | 1.38 | 1550 |
| 5 | 2147 | 1.35 | 1585 | 2147 | 1.35 | 1595 | 2147 | 1.36 | 1580 |
| 6 | 2145 | 1.38 | 1550 | 2144 | 1.40 | 1530 | 2145 | 1.40 | 1536 |

TABLE 1-continued

| | Engr. 1 | | | | | | | | |
|---|---|---|---|---|---|---|---|---|---|
| | Measurement 1 | | | Measurement 2 | | | Measurement 3 | | |
| Group 2 | FO | BW | Q | FO | BW | Q | FO | BW | Q |
| AVG | 2143.17 | 1.39 | 1542.67 | 2143.17 | 1.39 | 1543.33 | 2143.50 | 1.37 | 1561.33 |
| MIN | 2139.00 | 1.35 | 1470.00 | 2139.00 | 1.35 | 1500.00 | 2139.00 | 1.36 | 1536.00 |
| MAX | 2147.00 | 1.46 | 1585.00 | 2147.00 | 1.43 | 1595.00 | 2147.00 | 1.40 | 1580.00 |

TABLE 2

| Engr. 1 - Transmission | | | | | | |
|---|---|---|---|---|---|---|
| FO AVG | BW AVG | Q AVG | FO STDEV | BW STDEV | Q STDEV | % Q Error |
| 2142.7 | 1.4 | 1533.7 | 0.577 | 0.029 | 32.563 | 2.12 |
| 2141.3 | 1.4 | 1558.3 | 1.155 | 0.005 | 5.774 | 0.37 |
| 2145.0 | 1.4 | 1560.7 | 0.000 | 0.010 | 11.015 | 0.71 |
| 2139.0 | 1.4 | 1516.7 | 0.000 | 0.039 | 41.633 | 2.75 |
| 2147.0 | 1.4 | 1586.7 | 0.000 | 0.007 | 7.638 | 0.48 |
| 2144.7 | 1.4 | 1538.7 | 0.577 | 0.009 | 10.263 | 0.67 |
| 2143.28 | 1.38 | 1549.11 | 0.38 | 0.02 | 18.15 | 1.18 |
| 2139.00 | 1.35 | 1516.67 | 0.00 | 0.00 | 5.77 | — |
| 2147.00 | 1.41 | 1586.67 | 1.15 | 0.04 | 41.63 | — |

TABLE 3

| | Engr. 2 | | | | | | | | |
|---|---|---|---|---|---|---|---|---|---|
| | Measurement 1 | | | Measurement 2 | | | Measurement 3 | | |
| Group 2 | FO | BW | Q | FO | BW | Q | FO | BW | Q |
| 1 | 2149 | 1.42 | 1515 | 2148.5 | 1.43 | 1500 | 2148 | 1.48 | 1450 |
| 2 | 2150 | 1.41 | 1520 | 2150 | 1.42 | 1512 | 2144 | 1.46 | 1465 |
| 3 | 2144 | 1.45 | 1477 | 2144 | 1.47 | 1460 | 2149 | 1.50 | 1435 |
| 4 | 2150 | 1.48 | 1457 | 2150 | 1.47 | 1465 | 2150 | 1.50 | 1430 |
| 5 | 2152 | 1.40 | 1534 | 2152 | 1.47 | 1515 | 2143 | 1.53 | 1400 |
| 6 | 2143 | 1.38 | 1550 | 2145 | 1.38 | 1555 | 2150 | 1.37 | 1570 |
| AVG | 2148.00 | 1.42 | 1508.83 | 2148.25 | 1.43 | 1501.17 | 2147.33 | 1.47 | 1458.33 |
| MIN | 2143.00 | 1.38 | 1457.00 | 2144.00 | 1.38 | 1460.00 | 2143.00 | 1.37 | 1400.00 |
| MAX | 2152.00 | 1.48 | 1550.00 | 2152.00 | 1.47 | 1555.00 | 2150.00 | 1.53 | 1570.00 |

TABLE 4

| Engr. 2 - Reflective | | | | | | |
|---|---|---|---|---|---|---|
| FO AVG | BW AVG | Q AVG | FO STDEV | BW STDEV | Q STDEV | % Q Error |
| 2148.5 | 1.4 | 1488.3 | 0.500 | 0.033 | 34.034 | 2.29 |
| 2148.0 | 1.4 | 1499.0 | 3.464 | 0.026 | 29.715 | 1.98 |
| 2145.7 | 1.5 | 1457.3 | 2.887 | 0.023 | 21.127 | 1.45 |
| 2150 | 1.5 | 1450.7 | 0.000 | 0.019 | 18.339 | 1.26 |
| 2149.0 | 1.5 | 1483.0 | 5.196 | 0.069 | 72.505 | 4.89 |
| 2146.0 | 1.4 | 1558.3 | 3.606 | 0.007 | 10.408 | 0.67% |
| 2147.86 | 1.44 | 1489.44 | 2.61 | 0.03 | 31.02 | 2.09 |
| 2145.67 | 1.38 | 1450.67 | 0.000 | 0.01 | 10.41 | — |
| 2150.00 | 1.48 | 1558.33 | 5.20 | 0.07 | 72.51 | — |

TABLE 5

| Engineer 1 | Q Change | Engineer 2 | Q Change |
|---|---|---|---|
| Transmission Measurement | From Control | Reflective Measurement | From Control |
| 1106 | 2.59% | 1549 | 3.85% |
| 1077 | Control (0%) | 1489 | 0% |

While the system and method have been described in terms of what are presently considered to be specific embodiments, the disclosure need not be limited to the disclosed embodiments. It is intended to cover various modifications and similar arrangements included within the spirit and scope of the claims, the scope of which should be accorded the broadest interpretation so as to encompass all such modifications and similar structures. The present disclosure includes any and all embodiments of the following claims.

What is claimed is:

1. A filter comprising:
   a block of dielectric material with a top surface including a patterned region, a bottom surface, and side surfaces;
   a through-hole extending through the block from the top surface to the bottom surface, the through-hole being partially surrounded by the patterned region; and
   a wall extending from the top surface, the wall having an inner surface, an outer surface, and a roof, wherein
   the bottom surface, side surfaces, outer surface, and roof have a first coating including glass frit,
   the patterned region, through-hole and inner surface have a second coating including glass frit, and
   the glass frit in the first coating is at least 20% greater than the glass frit in the second coating.

2. The filter of claim 1, wherein the glass frit in the first coating is at least 30% greater than the glass frit in the second coating.

3. The filter of claim 2, wherein the glass frit in the first coating is at least 40% greater than the glass frit in the second coating.

4. The filter of claim 1, wherein the wall extends along a perimeter of the top surface.

5. The filter of claim 4, wherein the wall includes a slot extending there through from the inner surface to the outer surface.

6. The filter of claim 5, wherein the wall includes a post formed between the slot and a second, spaced-apart slot extending from the inner surface to the outer surface.

7. The filter of claim 6, wherein a second post and the post are located on a similar side surface of the block.

8. The filter of claim 6, wherein the patterned region of the top surface continuously extends to the post.

9. The filter of claim 1, wherein a cavity is defined by the top surface and the wall.

10. A duplex filter comprising at least two filters according to claim 1.

11. A system comprising:
a printed circuit board having a top surface and including input and output pads; and
a filter including:
a block of dielectric material with a top surface including a patterned region, a bottom surface, and side surfaces,
a through-hole extending through the block from the top surface to the bottom surface, and
a wall extending from the top surface, the wall having an inner surface, an outer surface, and a roof, the wall including a first post formed between two spaced-apart slots extending from the inner surface to the outer surface, and a second post formed between two other spaced-apart slots extending from the inner surface to the outer surface, wherein
the bottom surface, side surfaces, outer surface and roof have a first coating of silver and glass frit,
the patterned region, through-hole and inner surface have a second coating of silver and glass frit, and
the first and second coatings have different compositions.

12. The system of claim 11, wherein the glass frit in the first coating is at least 20% greater than the glass frit in the second coating.

13. The system of claim 11, wherein the input and output pads of the printed circuit board contact the first and second posts.

14. The system of claim 13, wherein the roof is coupled to the top surface of the printed circuit board.

15. The system of claim 11, wherein the through-hole is partially surrounded by the patterned region.

16. A method of patterning a filter comprising:
providing a dielectric block filter including a top surface, a bottom surface, side surfaces, a through-hole extending through the block filter from the top surface to the bottom surface, and a wall extending from the top surface, the wall having an inner surface, an outer surface, and a roof;
masking the top surface, through-hole, and inner surface of the wall;
depositing a first coating including glass frit and silver on the side surfaces, outer surface and roof;
masking side surfaces, outer surface and roof;
depositing a second coating including glass frit and silver on the top surface, through-hole, and inner surface of the wall; and
etching the second coating deposited on the top surface such that an area entirely surrounding the through-hole includes the second coating,
wherein the glass frit in the first coating is at least 20% greater than the glass frit in the second coating.

17. The method of claim 16, wherein
the wall includes two spaced-apart slots extending there through from the inner surface to the outer surface,
the wall includes a post formed between the two spaced-apart slots, and
the top surface includes a second area outside the area with the deposited second coating, and continuously extends to the post.

18. The method of claim 17, further comprising:
coupling the roof to a top surface of a printed circuit board; and
coupling the post to a pad on the top surface of the printed circuit board.

19. The method of claim 16, wherein the glass frit in the first coating is at least 30% greater than the glass frit in the second coating.

20. The method of claim 19, wherein the glass frit in the first coating is at least 40% greater than the glass frit in the second coating.

* * * * *